United States Patent
Della Schiava et al.

(10) Patent No.: US 11,946,960 B2
(45) Date of Patent: Apr. 2, 2024

(54) SMART PLUG AND METHOD FOR DETERMINING OPERATING INFORMATION OF A HOUSEHOLD APPLIANCE BY A SMART PLUG

(71) Applicant: Electrolux Appliances Aktiebolag, Stockholm (SE)

(72) Inventors: Luca Della Schiava, Porcia (IT); Enrico Marson, Porcia (IT); Gilberto Pin, Porcia (IT); Paolo Posa, Porcia (IT)

(73) Assignee: Electrolux Appliances Aktiebolag, Stockholm (SE)

( * ) Notice: Subject to any disclaimer, the term of this patent is extended or adjusted under 35 U.S.C. 154(b) by 397 days.

(21) Appl. No.: 17/265,375

(22) PCT Filed: Aug. 27, 2019

(86) PCT No.: PCT/EP2019/072881
§ 371 (c)(1),
(2) Date: Feb. 2, 2021

(87) PCT Pub. No.: WO2020/043737
PCT Pub. Date: Mar. 5, 2020

(65) Prior Publication Data
US 2021/0293862 A1   Sep. 23, 2021

(30) Foreign Application Priority Data

Aug. 31, 2018   (EP) ..................................... 18192089

(51) Int. Cl.
*G01R 21/06* (2006.01)
*G01R 21/133* (2006.01)
(Continued)

(52) U.S. Cl.
CPC ......... *G01R 21/06* (2013.01); *G01R 21/1331* (2013.01); *H01R 13/6683* (2013.01);
(Continued)

(58) Field of Classification Search
CPC . G01R 21/06; G01R 21/1331; H02J 13/0005; H02J 13/00002; H01R 13/6683; H01R 13/6691
(Continued)

(56) References Cited

U.S. PATENT DOCUMENTS 10,931,142 B2   2/2021   Moon et al.
2010/0305773 A1  12/2010   Cohen
(Continued)

FOREIGN PATENT DOCUMENTS

CN   108390217 A   8/2018
EP    2402771 A2    1/2012
(Continued)

OTHER PUBLICATIONS

Chinese Office Action with Search Report for Chinese Application No. 201980054149.9, dated May 17, 2023 with translation, 22 pages.
(Continued)

*Primary Examiner* — Lee E Rodak
*Assistant Examiner* — Trung Q Nguyen
(74) *Attorney, Agent, or Firm* — Moore & Van Allen PLLC; R. W. McCord Rayburn (57) ABSTRACT

A smart plug designed to electrically connect a household appliance to power lines. The smart plug has an electronic controller configured to measure current and voltage of the electric power supplied to household appliance via a smart plug, determine electric quantities indicative at least of prefixed current harmonics and/or prefixed voltage harmonics, based on said measured current and voltage, determine
(Continued)

load information which are indicative of electric loads of the household appliance being activated during an operating cycle performed by household appliance, based on determined electric quantities; determine the operating cycle performed by the household appliance based on the load information, communicate determined operating cycle to a network system.

28 Claims, 5 Drawing Sheets

(51) Int. Cl.
*H01R 13/66* (2006.01)
*H02J 13/00* (2006.01)

(52) U.S. Cl.
CPC .... *H01R 13/6691* (2013.01); *H02J 13/00002* (2020.01); *H02J 13/0005* (2020.01)

(58) Field of Classification Search
USPC ............ 324/140 R–142, 600, 622, 623, 678, 324/76.11, 76.39, 76.77
See application file for complete search history.

(56) References Cited

U.S. PATENT DOCUMENTS

| | | |
|---|---|---|
| 2011/0098867 A1 | 4/2011 | Jonsson et al. |
| 2011/0251807 A1 | 10/2011 | Rada et al. |
| 2011/0298284 A1 | 12/2011 | Thomson et al. |
| 2013/0138651 A1 | 5/2013 | Lu et al. |
| 2015/0066227 A1 | 3/2015 | Chapel et al. |
| 2015/0233984 A1 | 8/2015 | Choe et al. |
| 2017/0324195 A1 | 11/2017 | Eriksen et al. |
| 2018/0226755 A1* | 8/2018 | Davies ............... H01R 13/7175 |

FOREIGN PATENT DOCUMENTS

| | | |
|---|---|---|
| EP | 3358692 A1 | 8/2018 |
| IN | 104764954 A | 7/2015 |
| KR | 101714698 B1 | 3/2017 |
| KR | 1020170024880 A | 3/2017 |
| WO | 20180053644 A1 | 3/2018 |

OTHER PUBLICATIONS

International Search Report and Written Opinion for International Application No. PCT/EP/072881, dated Nov. 25, 2019, 12 pages.
Electrolux Appliances Aktiebolag, Korean Patent Application No. 10-2021-7004558, Office Action, dated Feb. 1, 2024.

* cited by examiner

SMART PLUG AND METHOD FOR DETERMINING OPERATING INFORMATION OF A HOUSEHOLD APPLIANCE BY A SMART PLUG

This application is a U.S. National Phase application of PCT International Application No. PCT/EP2019/072881, filed Aug. 27, 2019, which claims the benefit of European Application No. 18192089.3, filed Aug. 31, 2018, both of which are incorporated by reference herein.

FIELD OF THE INVENTION

The present invention relates to a smart plug, which is designed to recognise the electric loads of a household appliance, which are activated during an operating cycle performed by the household appliance, and determines the operating cycle performed by the household appliance based on the recognised appliance loads.

BACKGROUND

As is known, nowadays some household appliance, such as refrigerators, laundry washing machines and the like, are provided with communication devices which connects the household appliance to a home network system in order to exchange data one to the other and with remote computing apparatus.

Communication devices generally comprises WiFi electronic devices, which are permanently mounted in the household appliance and are configured to perform a short-range data communication with the home network system.

As a result, data generated by household appliances may be collected and elaborated by algorithms performed by remote computing apparatus which communicate the elaboration results, for example indicative of appliance services/information, to the smartphone of the user of the household appliance.

However, some existing household appliances, which are not provided with any electronic connection system, cannot be included in a home network system, and thus prevent their users to get the above disclosed appliance services/information.

Smart plug is a technology developed for making it possible to connect the existing household appliances without connecting devices, with a network system.

The smart plug is usually plugged into an indoor socket to supply electric power to the household appliance connected thereto, and typically, has the function of measuring electric power consumption of the household appliance and transmitting the measurement result to the remote computing apparatus via the home network system.

EP 3 358 692 A1 discloses a power plug for coupling an electrical appliance to an electrical power supply. The plug comprises: a current sensor measuring current supplied through the plug to the electrical appliance; a voltage sensor which measures voltage supplied through the plug to the electrical appliance; and a processor which is configured to: determine power consumption data from data relating to the current and voltage measurements made by the current and voltage sensors; and monitor whether a fault has developed in the appliance, based on the power consumption data; and transmit information relating to the fault of the electrical appliance.

US 2011/098867 A1 discloses a device for assessing the nature of an electrical load. The device comprises: a transducer block interposed between a power supply and an electrical load; a signal electronics section operative to receive a signal derived from the transducer block; one or more processors operative to analyze one or more of the received signals and to determine one or more indicia of the signal;
a processor of the one or more processors operative to match the signal indicia with stored indicia; and, a processor of the one or more processors operative to assess the nature of the load from the matched indicia.

US 2011/251807A1 discloses a device for monitoring the detailed energy usage of an electrical device in a network of electrical devices such as in a home or small office from a single point in the network. The device comprises: a controller coupled to a power supply; means for measuring a first plurality of power supply parameters and a second, subsequent, plurality of power supply parameters taken at a point upstream of the electrical device to be monitored; an input-output module coupled to the energy monitoring device; and a memory programmed with instructions to identify the presence of the electrical device coupled to the power supply and a state of the electrical device from a change detected between the first plurality of power supply parameters and the second plurality of power supply parameters, and the energy monitoring device is further programmed to monitor an input-output module coupled to the energy monitoring device.

SUMMARY

It is an aspect of the present disclosure to provide a smart plug that is able to determine information indicative of the operating cycles performed by an existing household appliance based on a recognition of the loads activated during the operating cycles, and communicate the determined operating cycle information to a remote computing system, without adding a new configuration/components to the existing home appliance.

In detail, the present disclosure relates to household appliance connectivity area as retrofit of non-connectible devices, in order to give to the existing non-connectible appliances the same possibilities and services available for the connectible ones.

It is an aspect of the present disclosure to provide a smart plug designed to electrically connect a household appliance to power lines, said smart plug comprising electronic control means configured to: measure current and voltage of the electric power supplied to said household appliance via the smart plug, determine electric quantities indicative of at least current harmonics and/or voltage harmonics, based on measured current and voltage, determine load information which are indicative of electric loads of said household appliance being activated during an operating cycle performed by said household appliance, based on said determined electric quantities, determine the operating cycle performed by the household appliance based on said load information; communicate said determined operating cycle to a network system.

Preferably, the electronic control means are further configured to: store electric signatures of the loads which contains information indicative of one or more of said electric quantities associated to activation of electric loads of said household appliance when the household appliance performs an operating cycle, determine electric signatures based on one or more electric quantities, determine said load information based on said electric signatures determined when the operating cycle was performed, and said stored electric signatures.

Preferably, the electronic control means are further configured to perform a smart plug auto-tuning program wherein: when the household appliance is performing a prefixed operating cycle, one or more load electric quantities are determined during the predetermined activation of the electric loads; load electric signatures of said electric loads are determined based on said electric quantities determined during the prefixed operating cycle; said load electric signatures of said electric loads are stored in storage means of said smart plug.

Preferably, the network system comprises a remote computing system and a home network system; said electronic control means being configured to perform a communication with said remote computing system via said home network system in order to exchange data with the remote computing system; the electronic control means are further configured to: receive from said remote computing system and store in said storage means, activation load profiles associated to the operating cycles which may be performed by the household appliance; determine the activation load profiles based on said load electric signatures determined when the household performed the operating cycle; determine the operating cycle performed by the household appliance based on said activation load profiles determined when the household performed the operating cycle and said activation load profiles associated to the operating cycle stored in said storage means.

Preferably, the electric quantities further comprises: active power, reactive power, normalized active power, normalized reactive power, and phase displacement between voltage and current.

Preferably, an electric load activated during said operating cycle comprises an electric motor; the load electric signature of said electric load comprising said electric motor being based on at least the third current harmonic.

Preferably, an electric load activated during said operating cycle comprises an electric resistor; the load electric signature of said electric load comprising said electric resistor being based on at least active power, and reactive power.

Preferably, an electric load activated during said operating cycle comprises a motor-controlled valve; the load electric signature of said electric load comprising said electric resistor being based on at least reactive power and odd current harmonics Preferably, said electronic control means comprises first electronic unit and a second electronic unit; the first electronic unit being configured to: measure current and voltage of the electric power supplied to said household appliance via said smart plug, determine electric quantities indicative at least of current harmonics and/or voltage harmonics, based on said measured current and voltage, determine load information which are indicative of electric loads of said household appliance being activated during an operating cycle performed by said household appliance, based on said determined electric quantities, determine the operating cycle performed by the household appliance based on said load information; the second electronic unit being configured to: communicate said determined operating cycle to a network system.

In accordance with an aspect of the present disclosure is also provided a method of controlling a smart plug which is designed to electrically connect a household appliance to power lines and is configured to communicate information indicative of operating cycle performed by the household appliance to a network system, the method comprising: measuring current and voltage of the electric power supplied to said household appliance via said smart plug, determining electric quantities indicative at least of current harmonics and/or voltage harmonics, based on said measured current and voltage, determining load information which are indicative of electric loads of said household appliance being activated during an operating cycle performed by said household appliance based on said determined electric quantities; determining the operating cycle performed by the household appliance based on said load information; communicating said determined operating cycle to said network system.

Preferably, the method comprises: storing in said smart plug, load electric signatures which contains information indicative of one or more of said electric quantities during the activation of respective electric loads of said household appliance, when the household appliance is performing an operating cycle, determining load electric signatures identifying the activation of said electric loads based on one or more electric quantities, determining said load information based on said load electric signatures determined when the operating cycle was performed, and said stored load electric signatures.

Preferably, the method comprises: performing a smart plug auto-tuning program wherein: when the household appliance is performing a prefixed operating cycle, one or more load electric quantities are determined during the predetermined activation of the electric loads; load electric signatures of said electric loads are determined based on said electric quantities determined during the prefixed operating cycle; said load electric signatures of said electric loads are stored in storage means of said smart plug.

Preferably, the method comprises: receiving from said remote computing system and store in said storage means, activation load profiles associated to the operating cycles which may be performed by the household appliance; determining the activation load profiles based on said load electric signatures determined when the household performed the operating cycle; determining the operating cycle performed by the household appliance based on said activation load profiles determined when the household performed the operating cycle and said activation load profiles associated to the operating cycle stored in said storage means.

Preferably, said electric quantities further comprises: active power, reactive power, normalized active power, normalized reactive power, and phase displacement between voltage and current.

Preferably, smart plug comprises a first electronic unit and a second electronic unit, the first electronic unit being configured to: measure current and voltage of the electric power supplied to said household appliance via said smart plug), determine electric quantities indicative at least of current harmonics and/or voltage harmonics, based on said measured current and voltage, determine load information which are indicative of electric loads of said household appliance being activated during an operating cycle performed by said household appliance, based on said determined electric quantities, determine the operating cycle performed by the household appliance based on said load information; the second electronic unit being configured to: communicate said determined operating cycle to a network system.

BRIEF DESCRIPTION OF THE DRAWINGS

Further characteristics and advantages of the present invention will be highlighted in greater detail in the following detailed description of some of its preferred embodiments, provided with reference to the enclosed drawings.

In the drawings, corresponding characteristics and/or components are identified by the same reference numbers.

In particular:

FIG. 4 illustrates five graphs illustrating an example of the electric quantities elaborated by the smart plug to determine the electric loads activated during an operating cycle; whereas

DETAILED DESCRIPTION OF EXEMPLARY EMBODIMENTS

Configurations shown in embodiments enumerated in the present specification and the drawings are just exemplary embodiments of the present disclosure, and it should be understood that there are various modified examples capable of replacing the embodiments of the present specification and the drawings at the time of filling the present application.

Reference will now be made in detail to the embodiments of the present disclosure, examples of which are illustrated in the accompanying drawings, wherein like reference numerals refer to like elements throughout.

The smart plug and the method of the present disclosure has proved to be particularly advantageous when applied to a household appliance corresponding to a laundry washing machine, as described below.

It should be understood that although the smart plug and method are described with reference to a household appliance corresponding to a laundry washing machine, other applications are contemplated.

As can be appreciated, the present invention can be conveniently applied to other kind of household appliances such as, for example, fridge, freezer, refrigerators, drying machines, ovens, microwaves, dishwasher, induction cooker, etc.

Figure 1:
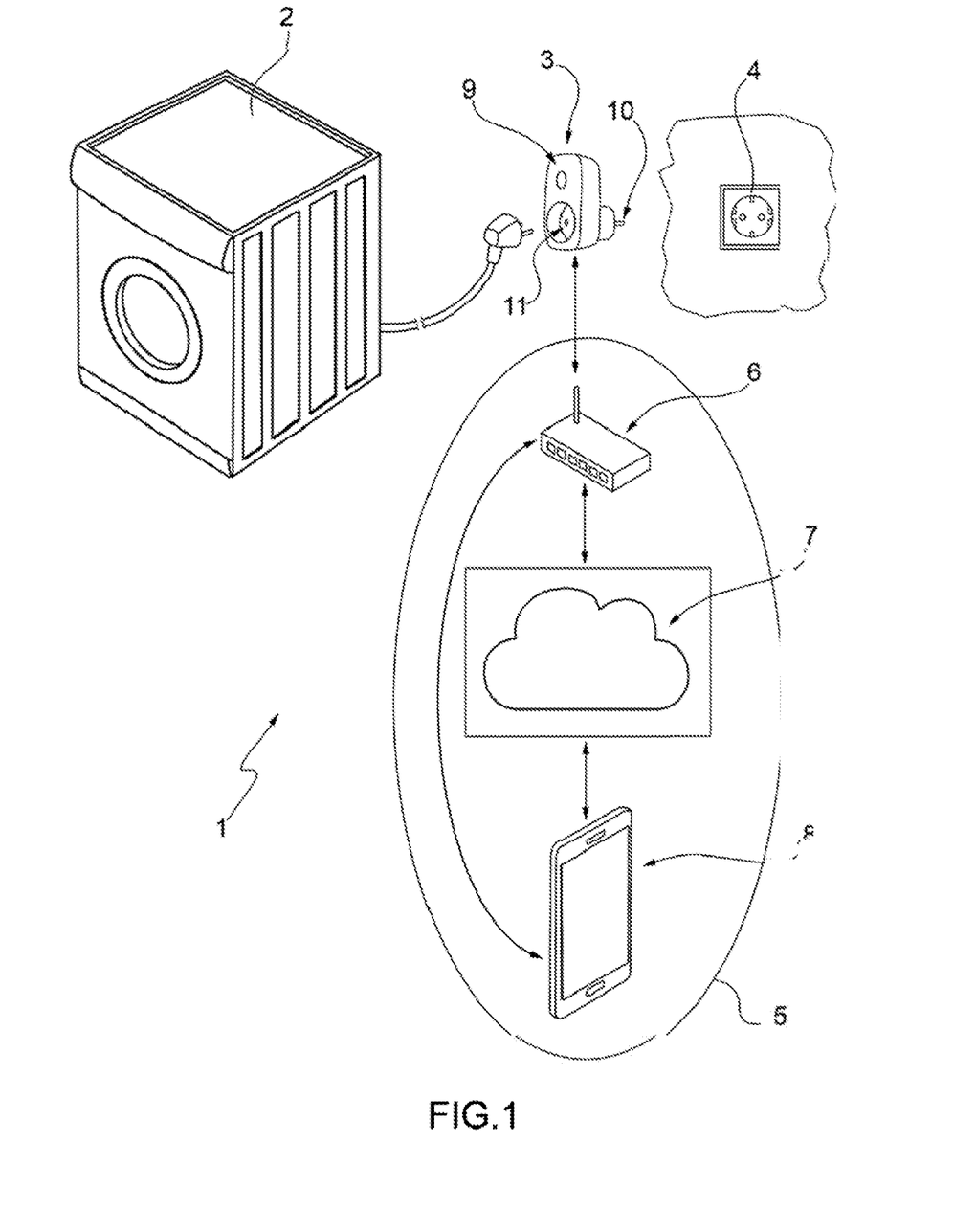
FIG. 1 is a schematic view illustrating a system for determining operating information of a household appliance 2 by using a smart plug, according to an example embodiment of the present disclosure.

With reference to FIG. 1, number 1 indicates a system for determining operating information of a household appliance 2, which in the exemplary embodiments illustrated in the attached Figures, corresponds to a laundry washing machine.

The system 1 comprises: a smart plug 3, which is designed to be plugged into a socket 4 to supply electric power to the household appliance 2 and is configured to determine operating information of the household appliance 2, and a network system 5 which exchange data with the smart plug 3 and receive from the latter operating information.

According to an exemplary embodiment illustrated in FIG. 1, the network system 5 may comprise: a home network system 6, a remote computing system 7 and a user terminal 8.

The user terminal 8 may correspond to any commonly-used portable devices held by a user, such as a smartphones, personal digital assistants (PDAs), portable multimedia players (PMPs) which is configured to perform computer programs such as, for example, mobile applications.

The home network system 6 may be configured to exchange data between the smart plug 3, the remote computing system 7 and the user terminal 8.

It is however understood that, alternatively, or in addition to the home network system 6, the user terminal 8 may also be configured to exchange data/signals by performing a wireless communication directly with the remote computing system 7.

Preferably, the home network system 6 may be configured to receive the operating information of the household appliance 2 from the smart plug 3, and transmit the operating information of the household appliance 2 to the remote computing system 7.

The home network system 6 may be further configured to receive an appliance code identifying the household appliance 2, from the user terminal 8, and transmit the appliance code to the remote computing system 7. The appliance code may univocally identify the household appliance 2 connected to the smart plug 3. Preferably, the home network system 6 may be further configured to receive the appliance code identifying the household appliance 2, from the remote computing system 7 and transmits the appliance code to the smart plug 3.

Preferably, the user terminal 8 may be configured to perform a mobile application, which is configured to activate a smart plug appliance service. Preferably, the mobile application may be configured to receive in input the appliance code and transmits the received appliance code to the remote computing system 7. Preferably, the mobile application may be configured to receive the appliance code from the user. Preferably, the user may input the appliance code in the user terminal 8 during an appliance identification phase performed by the mobile application. Preferably, the mobile application may be configured to download from the remote computing system 7 a list of operating cycles, which are implementable by the identified household appliance. Preferably, the mobile application may be configured to download from the remote computing system 7 indication of prefixed operating cycles to be implemented by the household appliance during an auto-tuning program (disclosed hereinafter in detail) which is performed by the smart plug 3 to determine electric signature of the electric loads comprised in the household appliance 2.

The home network system 6 may exchange data with the smart plug 3 and/or the user apparatus 8 preferably through near field communication (NFC), such as wireless fidelity (WiFi), Bluetooth, or Zigbee, and the like. The home network system 6 may also exchange data with the remote computing system 7 preferably through a local area network (LAN) such as Ethernet or a wide area network (WAN) such as the Internet, and the like. It is understood that the home network system 6 may comprise any kind of modem that enables wireless communication, an Internet sharer, a hub device, a switch device, a bridge device, a router device, a gateway device or the like.

According to an exemplary embodiment illustrated in FIG. 1, the remote computing system 7 is configured to: receive the operating information of the household appliance from the smart plug 3, store the operating information of the household appliance, and elaborate the operating information of the household appliance 2.

Preferably, the remote computing system 7 may process the operating information received from the smart plug 3 for determining, for example, maintenance data/information, diagnostic data/information of the household appliance 2. The elaborated data may be based on statistical analysis concerning: activation times of electric loads comprised in the household appliance; appliance and/or loads' lifetime, appliance and/or loads' diagnosis, detection/prediction of malfunctioning of the appliance and/or of the electric loads, etc.

The elaborated data may be transmitted to the user apparatus 8 from the remote computing system 7. Preferably, elaborated data may be transmitted to the user apparatus 8 from the remote computing system 7 in response to a user request performed via the mobile application.

According to a preferred embodiment the remote computing system 7 may advantageously comprise an external server and/or be part of, a cloud computing system.

With reference to FIG. 1, the smart plug 3 may comprises an outer case 9 preferably made in rigid material, such as plastic material, a plug 10, which is structured to be plugged into the socket 4 to receive electric power from main power lines L; and a socket outlet 11 that provides the electric power to the home appliance 2. In the exemplary embodiment illustrated in FIG. 1, the outer case 9 may have a box-shaped rectangular parallelepiped. It is however understood that, aspects of the present disclosure are not limited thereto, and the outer case 9 may have any shape, such as for example cylindrical shape, oval shape, and the like. The plug 10 may be disposed at a side the outer case 9, preferably the rear side and may receive power of 110 V or 220 V from the main power lines L.

With regard to the socket outlet 11, it may be disposed at side of the outer case 9 preferably the front side and may provide the power of 110 V or 220 V received from the power lines L to the home appliance 2.

It is understood that shapes of the plug 10 and socket outlet 11 are structured based on the electric standard of the country wherein the smart plug 3 is used.

Figure 2:
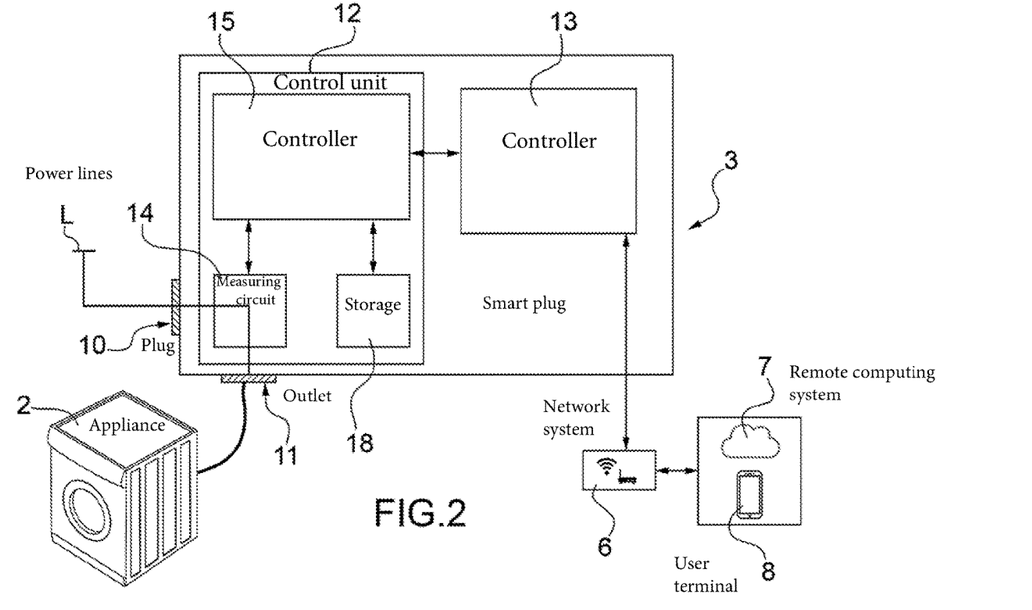
FIG. 2 is a block diagram of the smart plug according to an example embodiment of the present disclosure.

With reference to the exemplary embodiment shown in FIG. 2, the smart plug comprises an electronic controller 12 and an electronic controller 13.

According to a preferred embodiment, the electronic controller 12 may comprise an electric measuring circuit 14 configured to measure the current and the voltage of the electric power supplied to the home appliance 2 via the smart plug 3. Preferably, the electric measuring circuit 14 may be configured to repeatedly sample the current and voltage supplied to the household appliance 2 at prefixed instants, preferably every one millisecond.

According to a preferred embodiment, the electronic controller 12 may further comprise a control unit 15, which elaborates the measured current and the measure voltage to determine electric quantities (hereinafter disclosed in detail) being indicative of: current harmonics, voltage harmonics, active power, and reactive power. The control unit 15 may be also configured to determine electric quantities which are indicative of normalized active power and/or a normalized reactive power, and the phase displacement between voltage and current.

It is understood that: normalized active power may be determined based on the first current harmonic normalized to voltage and current vectors, normalized reactive power may be determined based on the first current harmonic normalized to voltage and current vectors, and phase displacement between voltage and current may be determined based on normalized active power and normalized reactive power.

For example, let the k-th voltage-harmonic vector Vk be made up of two components $$Vk = \begin{bmatrix} CosVk \\ SinVk \end{bmatrix}$$

which relate to the k-th harmonic sinusoidal component of the voltage by the relation $$vk(t) = CosVk\ \cos(2\pi kFt) + SinVk\ \sin(2\pi kFt) = Vk^T \begin{bmatrix} \cos(2\pi kFt) \\ \sin(2\pi kFt) \end{bmatrix}$$

where the superscript T represent the transpose of a vector and F the fundamental grid frequency. Accordingly, let the k-th current-harmonic vector Ik be made up of two components $$Ik = \begin{bmatrix} CosIk \\ SinIk \end{bmatrix}$$

which relate to the k-th harmonic sinusoidal component of the current by the relation $$ik(t) = CosIK\ \cos(2\pi kFt) + SinIk\ \sin(2\pi kFt) = Ik^T \begin{bmatrix} \cos(2\pi kFt) \\ \sin(2\pi kFt) \end{bmatrix}$$

Thanks to the above defined vectors Vk and Ik the normalized active power PA and the normalized reactive PQ power may be determined based on the following formula that exploits the first harmonic only:

$$PA = \frac{Vk^T Ik}{\sqrt{Vk^T Vk}} \text{ wherein } k \text{ is } 1.$$

$$PQ = \frac{Vk^T \begin{bmatrix} -SinIk \\ CosIk \end{bmatrix}}{\sqrt{Vk^T Vk}} \text{ wherein } k \text{ is } 1.$$

It is understood that normalized active power and reactive power above disclosed differs than the conventional non-normalized active and reactive powers that first account for the whole current/voltage signals (not just the first harmonic as in the present case) and do not involve normalization (here represented by the division by the norm of the voltage vector). The Applicant has found that this normalization of the power guarantees invariance of the harmonic signature of the load in those situations where the supply voltage is distorted (i.e., non purely sinusoidal) or for varying amplitudes of the supply voltage.

Figure 3A:
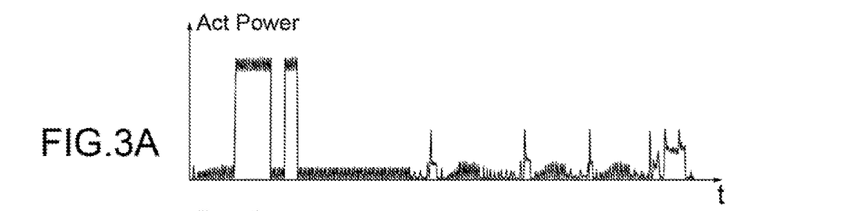
FIG. 3A is a graph illustrating an example of the active power profile determined by the smart plug during an operating cycle performed by a laundry washing machine.
Figure 3B:
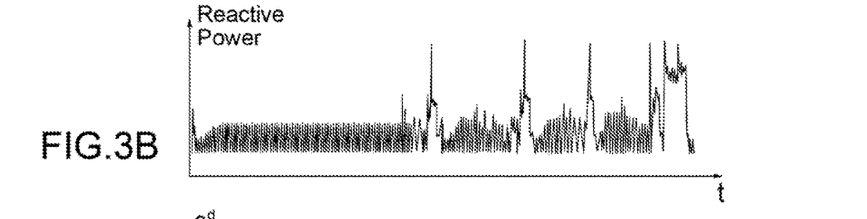
FIG. 3B is a graph illustrating an example of the reactive power profile determined by the smart plug during an operating cycle performed by a laundry washing machine.
Figure 3C:
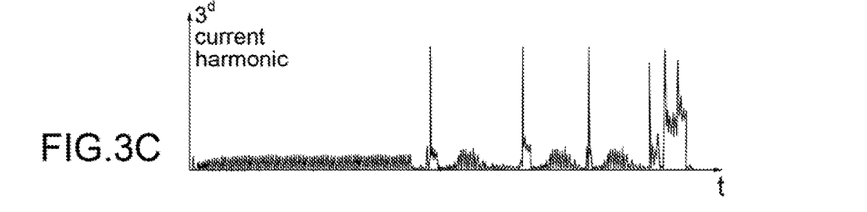
FIG. 3C is a graph illustrating an example of the third current harmonic profile determined by the smart plug during an operating cycle performed by a laundry washing machine.
Figure 3D:
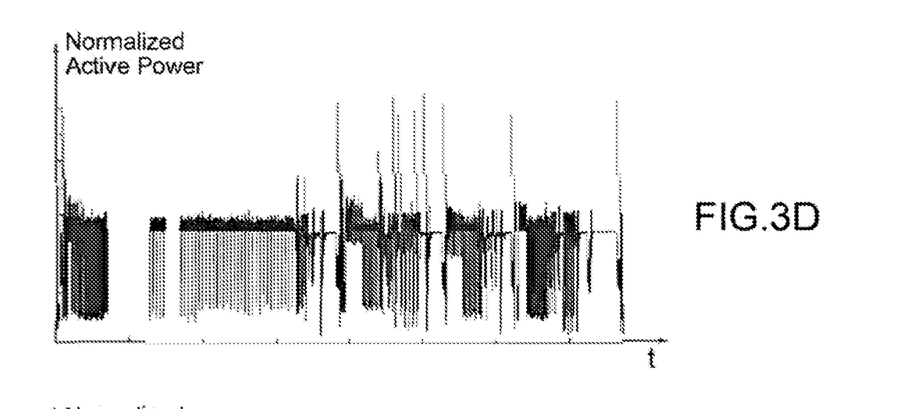
FIG. 3D is a graph illustrating an example of the normalized active power profile determined by the smart plug during an operating cycle performed by a laundry washing machine.
Figure 3E:
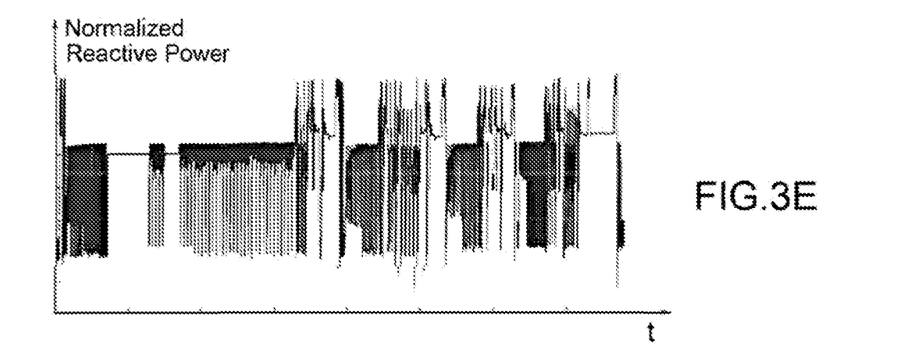
FIG. 3E is a graph illustrating an example of the normalized reactive power profile determined by the smart plug during an operating cycle performed by a laundry washing machine.

FIGS. 3A and 3B illustrate two exemplary graphs of the active power and respectively reactive power over the time, supplied to a laundry washing machine during an operating cycle, determined by the control unit 15. FIG. 3C illustrates an exemplary graph of the third current harmonics over the time, supplied to a laundry washing machine during an operating cycle, determined by the control unit 15. FIGS. 3D and 3E show two exemplary graphs of the active power and respectively the reactive power over the time, normalised to voltage and current vectors, supplied to a laundry washing machine during an operating cycle determined by the control unit 15.

According to a preferred embodiment, the control unit 15 may be provided with an observer module which determine the electric quantities based on the measured voltage and current. The Applicant has found that, for example, a Luenberg observer module is suitable to determine the electric quantities above listed.

Preferably, the current harmonics, voltage harmonics determined by the control unit 15 may correspond to the odd harmonics, preferably the first, the third and the fifth harmonics. Preferably, the control unit 15 may be configured to determine the electric quantities above listed by elaborating the current and voltage sampled by the electric measuring circuit 14 preferably every 100 millisecond.

According to a preferred embodiment the control unit 15 may be further configured to recognise the electric loads of the household appliance 2 which has been activated during an operating cycle, based on one or more the electric quantities listed above.

The Applicant has found that an electric load, when activated, causes on the electric quantities listed above some changes (amplitude, harmonics, etc), and those changes defines an "electric signature" identifying such activated electric load.

In other words, the Applicant has found that electric loads of the household appliance may be recognised, when switched on, by examining the "electric traces, i.e. electric signatures" which appears on the electric quantities above listed. Conveniently, the electric signature of a load may be characterized by a combination of one or more of the electric quantities listed above. However, it is understood that the "electric signature" of a load depends of the kind of electric load activated.

For example, a laundry washing machine may comprise the following loads: a heater device comprising a resistor to heat the washing water, a motor unit provided with a brushed motor or an inverter controlled motor, to rotate the drum, a motor unit of a drain pump comprising synchronous or asynchronous motor, motor units of electro-valves comprising synchronous or asynchronous motor.

For example, an electric signature of the activation of the heater device may be based on two electric quantities being the active power and the reactive power. Indeed, a null value of reactive power and an active power different to zero may be indicative of the activation state of an electric resistor of the heater device. Therefore, for example, it is possible to recognise when that heater device passes from a switched-off state to a switched-on state, an vice versa, based on the change of active and reactive powers.

Moreover, for example, an electric signature of the activation of the motor unit of the drum may be based on current harmonic, preferably the third current harmonic. Therefore, it is possible to detect that the motor unit has been activated when a third current harmonic occurs.

Moreover, for example, an electric signature of the activation of the motor unit of a drain pump may be based on the phase displacement between voltage and current, and the third current harmonic.

Moreover, the concurrent activations of two electric loads, such as motor unit to rotate the drum and the drain pump and the motor may be determined based on the phase displacement between voltage and current.

Moreover, the activation of any electric loads in the household appliance may be distinguished based on the normalized active and reactive powers and odd current and voltage harmonics.

According to a preferred embodiment, the electronic controller 12 further comprise a storage unit 18, which is configured to store the electric signatures of the loads of the household appliance 2.

Preferably, as hereinafter disclosed in detail, the control unit 15 is configured to perform a smart plug setting program/algorithm, hereinafter called smart plug auto-tuning program, which during the first operating cycle performed by the household appliance 2, estimates the electric signatures of the loads and store the estimated electric signatures in the storage unit 18.

The control unit 15 is further configured to recognise the electric loads being activated during the operating cycle based on the electric signatures determined during the operating cycle and the stored electric signatures. Preferably, the control unit 15 may be configured to compare the electric signatures determined during the operating cycle and the electric signatures stored in the storage unit 18 and determine the activated electric load based on the results of comparison. For example, if the electric signatures determined during the operating cycle corresponds to the stored signature associated to a load, the control unit 15 determines the activation of the latter.

The control unit 15 may be further configured to determine for each activation of the recognised electric loads: the instants of activation (switch-on) and deactivation (switch off) of the load during the operating cycle, the duration of the activation of the loads, the start and end of the operating cycle.

The control unit 15 may be further configured to determine the operating cycle which the household appliance 2 has performed based on the recognised electric loads and their sequence of activation during the operating cycle. According to a preferred embodiment, the control unit 15 may be configured to determining an operating map which is indicative of an electrical loads activation profile and compare the latter with prefixed electric loads activation profiles associated with respective operating cycles.

The control unit 15 may be further configured to determine the operating cycle which has been performed by the household appliance 2 based on results of comparison between the prefixed electric loads activation profiles and the electric loads activation profile, previously determined on the basis of the recognition of the electric loads.

According to a preferred embodiment, the prefixed electric loads activation profiles may be transmitted by the remote computing system 7 to the smart plug 3 based on the application code. A prefixed loads activation profile may comprise data relating to: instants of activation (switch-on) and deactivation (switch off) of the load during the operating cycle, the duration of each activation of the loads, the start and end of the operating cycle.

With regard to the electronic controller 13, it may comprise a communication unit which is configured to transmit the operating cycle to the remote computing system 7 via the home network system 6. The communication unit may comprise a microcontroller which exchanges data through near field communication (NFC), such as wireless fidelity (WiFi), Bluetooth, or Zigbee, and the like.

It is understood that the control unit 15 may comprise a computing device, preferably a microcontroller, a microprocessor, analog front-end. Likewise, the electronic controller 13 may comprise a computing device, preferably a microcontroller, a microprocessor, analog front-end electrically connected to the microcontroller or microprocessor of the control unit 15.

Figure 5:
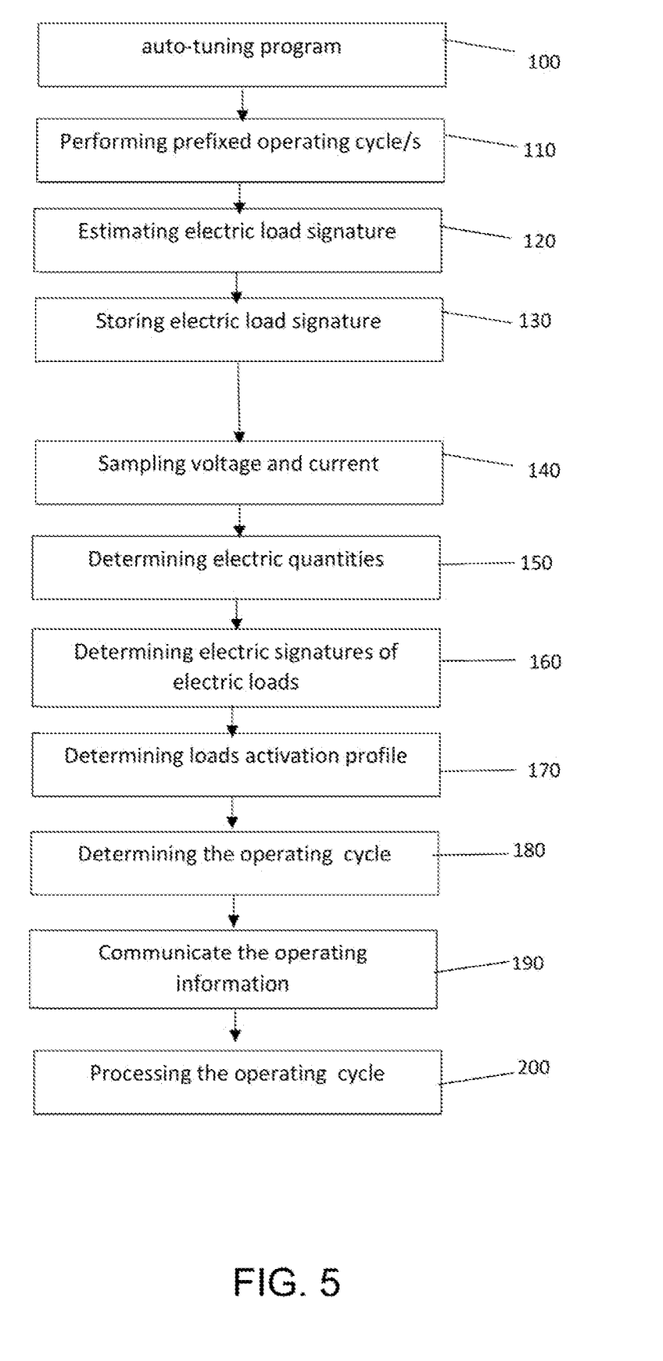
FIG. 5 is a flow chart illustrating the steps of the method for determining operating information of a household appliance 2 by using the smart plug, according to an example embodiment of the present disclosure.

FIG. 5 is a block diagram illustrating a control flow chart of the operations performed by the system 1 according to an embodiment of the present invention wherein it is supposed, only to simplify the comprehension of the present invention, to determine operating cycles of a laundry washing machine 2.

At the beginning, the user terminal 8 may performs a smart plug mobile application. The smart plug mobile application may be downloaded to the user terminal 8 from the remote computing system 7, in response to a user request. The smart plug mobile application, when implemented by the user terminal 8, may demand the user to input the appliance code associated to the laundry washing machine 2 connected to the smart plug 3. The appliance code is then transmitted by the user terminal 8 to the remote computing system 7.

The remote computing system 7 recognises the laundry washing machine 2 connected to the smart plug 3 and may determine the operating cycles which may be implemented by the recognised laundry washing machine 2. Furthermore the remote computing system 7 determines the loads activation profiles associated to the operating cycles which may be implemented by the recognised laundry washing machine. Furthermore, the remote computing system 7 determines auto-tuning information indicative of prefixed operating cycle/s, which the laundry washing machine have to perform during the auto-tuning program.

Preferably, the remote computing system 7 transmits to the smart plug 3, via the home network system 6: the operating cycles implementable by the laundry washing machine, the loads activation profiles associated to the operating cycles implementable by the laundry washing machine, and the auto-tuning information indicative the prefixed operating cycle/s which the laundry washing machine have to perform during the auto-tuning program. Preferably, the remote computing system 7 may also transmits to the smart plug 3, via the home network system 6 the appliance code.

Preferably, the remote computing system 7 transmits to the user apparatus 8 the auto-tuning information indicative the prefixed operating cycle/s which the laundry washing machine have to perform during the auto-tuning program. The user apparatus 8 displays to the user the prefixed operating cycle/s to be performed during the auto-tuning program.

The user performs the prefixed operating cycle/s and the smart plug 3 performs the auto-tuning program in order to estimate the electric signatures of the electric loads included in the house hold appliance 2 (block 100). During the implementation of the auto-tuning program, the electric measuring circuit 14 measures the voltage and current provided to the household appliance 2, the electric measuring circuit 14 determine the electric quantities above listed.

The control unit 15 estimates the electric load signature of the electric loads activated during the prefixed operating cycle, based on the determined electric quantities (block 120). Since the prefixed operating cycle contains the information about the electrical load activated during each interval, the control unit 15 is able to associate the electric signature to the corresponding electric load.

Furthermore the control unit 15 stores in the storage unit 18 the electric signatures of the loads of the household appliance 2 determined during the implementation of the prefixed operating cycles (block 130).

After having completed the auto-tuning program, the smart plug 3 is able to start the recognition of the operating cycles performed by the household appliance 2.

When a new operating cycle is performed, the electric measurement circuit 14 of the smart plug 3 measures current and voltage of the electric power provided to the household appliance 2 from the smart plug 3 (block 140).

Furthermore, the control unit 15 elaborates the measured current and the measure voltage to determine one or more of the electric quantities above listed, i.e.: current harmonics, voltage harmonics, active power, and reactive power, normalized active power and/or a normalized reactive power and phase displacement between voltage and current based on a normalized active power and/or a normalized reactive power (block 150).

Furthermore, the control unit 15 determine the electric signatures of the electric loads of the household appliance 2 which has been activated during an operating cycle, based on one or more the electric quantities listed above (block 160).

Furthermore, the control unit 15 recognise the electric loads which has been activated during the operating cycle based on the electric signatures of the electric loads. Preferably the electric loads activated during the operating cycles may be determined based on a comparison between the electric signature determined on the basis of the electric quantities, and the electric signatures of the loads stored during the auto-tuning program.

The control unit 15 may determines for any activation of the recognised loads: the instants of activation (switch-on) and deactivation (switch off) of the load during the operating cycle, the duration of the activation of the loads, the start and end of the operating cycle.

Figure 4:
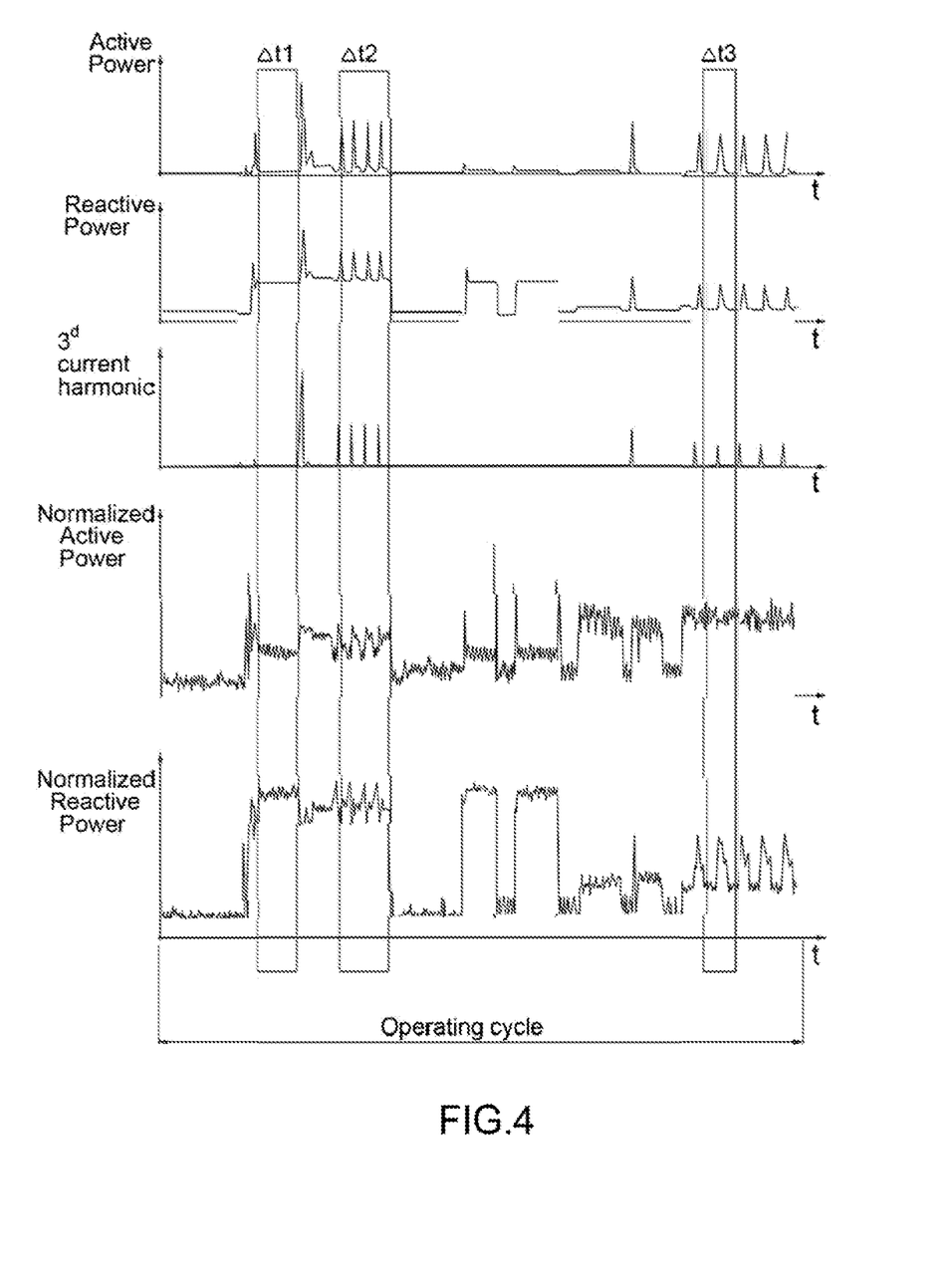

According to a preferred embodiment the control unit 15 observes electric quantities contained in prefixed widows time in order to recognise the electric load signatures. For example, if in a widows time, the control unit 15 detect a electric load signatures associated to the storaged electric load signatures, the control unit 16 recognise that during the widows time the load was activated. FIG. 4 shows five graphs indicating: the active power profile, the reactive power profile, the third current harmonic profile, the normalized active power profile, and the normalized reactive power profile. Furthermore in FIG. 4, $\Delta t1$, $\Delta t2$, $\Delta t3$ indicate respectively a first second and third windows time. Referring the example illustrated in FIG. 4, during the first windows time $\Delta t1$, the control unit 15 determines an electric signature corresponding to a first electric signature associated to the activation of an electric load being the drain pump. The first electric signature may be determined by observing that the third harmonic of current is zero, and the active and reactive power normalized are different to zero.

During the second window time $\Delta t2$, the control unit 15 may determine, other than the first electric signature indicating the activation of the drain pump, a second electric signature associated to activation of an electric load corresponding to an electric motor. The second electric signature may be associated to the third harmonic of current which passes to a value different to zero. During the third window time Δt3 the control unit 15 may determine other than the second signature, an electric signature corresponding to a third electric signature associated to the activation of an electrovalve. The electric signature may be associated to values of reactive and active normalized power.

Preferably, the control unit 15 is configured to determine loads activation profiles of the recognized loads during the operating cycle. Preferably the control unit 16 may compare the load activation profiles of the recognized loads with the correspondent the activation profiles of the operating cycles stored in the storage unit 18 and determine the operating cycle based on the result of comparison (block 170). Preferably the control unit 15 may determine the operating cycle which has been performed by the household appliance 2 based on results of comparison between the prefixed electric loads activation profile and the storage electric loads activation profiles of the stored operating cycles (block 180).

The control unit 15 communicates the determined operating information containing at least the operating cycle to the electronic controller 13, which transmits the received operating information to the remote computing system 7 via the home network system 6 (block 190). Preferably the control unit 15 communicates operating information containing the operating cycle and the appliance code.

The remote computing system 7 may store the received operating information based on the appliance code, and/or process the operating information of the household appliance 2. Preferably, the remote computing system 7 may process the operating information for determining, for example, maintenance data/information, diagnostic data/information of the household appliance 2. The elaborated data may be based on statistical analysis concerning: activation times of electric loads comprised in the household appliance; appliance and/or loads' lifetime, appliance and/or loads' diagnosis, detection/prediction of malfunctioning of the appliance and/or of the electric loads, etc.

The method and smart plug is able to determine information indicative of the operating cycles performed by a household appliance based on a recognition of the loads activated during the operating cycles, without adding a new configuration/components to an existing home appliance, and to a method for determining the operating cycles performed by a household appliance based on a recognition of the loads activated during the operating cycles, by using the smart plug.

Clearly, changes and variations may be made to smart plug and method without, however, departing from the scope of the present invention.

The invention claimed is:

1. A smart plug configured to electrically connect a household appliance to electrical power lines, said smart plug comprising:
   an electric measuring circuit configured to measure current and voltage of the electric power supplied to said household appliance, via said smart plug, and
   an electronic controller configured to:
      determine electric quantities indicative of at least current harmonics and/or voltage harmonics, based on said measured current and voltage,
      recognize a plurality of electric loads of said household appliance being activated during an operating cycle performed by said household appliance, based on said determined electric quantities,
      determine an operating cycle performed by the household appliance based on said recognized plurality of electric loads and a sequence of activation of said recognized plurality of electric loads during said operating cycle,
      communicate said determined operating cycle to a network system,
      store, in a storage of the smart plug, electric signatures of said plurality of electric loads, which contain information indicative of one or more of said electric quantities associated to activation of said electric loads of said household appliance,
      when the household appliance is performing an operating cycle, determine electric signatures based on said electric quantities, and
      recognize said electric loads and the sequence of activation of said plurality of electric loads based on said stored electric signatures and the electric signatures determined when the operating cycle was performed.

2. The smart plug according to claim 1, wherein said electronic controller is further configured to recognize said plurality of electric loads activated during said operating cycle based on a comparison between the electric signature determined on the basis of said electric quantities, and said stored electric signatures of said plurality of electric loads.

3. The smart plug according to claim 2, wherein said electronic controller is further configured to determine for any recognised electric load: instants of activation and deactivation of said electric load during the operating cycle, and the duration of the activation of said electric load.

4. The smart plug according to claim 1, wherein said electronic controller is further configured to observe said electric quantities contained in prefixed widows time in order to recognise said electric load signatures.

5. The smart plug according to claim 1, wherein said electronic controller is further configured to determine during a first windows time (Δt1), a first electric signature associated to an activation of an electric load being a drain pump; the first electric signature being determined when the third harmonic of current is zero and the active and reactive power normalized are different to zero.

6. The smart plug according to claim 1, wherein said electronic controller is further configured to determine during a second window time (Δt2), a second electric signature associated to an activation of an electric motor when the third harmonic of current passes to a value different to zero.

7. The smart plug according to claim 1, wherein said electronic controller is further configured to determine during a third window time (Δt3), a third electric signature which is associated to values of reactive and active normalized power and indicates an activation of electric load corresponding to an electrovalve.

8. The smart plug according to claim 1, wherein said electronic controller is further configured to:
   determine loads activation profiles of said recognized loads during said operating cycle,
   compare said determined load activation profiles of said recognized loads with correspondent stored activation profiles of prefixed operating cycles, and
   determine the operating cycle based on the result of said comparison.

9. The smart plug according to claim 8, wherein at least one loads activation profile comprises data relating to: instants of activation (switch-on) and deactivation (switch off) of the electric load during the operating cycle, the duration of each activation of the electric load, and the start and end of the operating cycle.

10. The smart plug according to claim 1, wherein said electronic controller is further configured to perform a smart plug auto-tuning program wherein:
when the household appliance is performing a prefixed operating cycle, one or more electric quantities are determined during the predetermined activation of the electric loads;
electric signatures of said electric loads are determined based on said electric quantities determined during said prefixed operating cycle; and
said electric signatures of said electric loads are stored in storage means of said smart plug.

11. The smart plug according to claim 1, wherein said electric signature of an electric load is characterized by a combination of electric quantities.

12. The smart plug according to claim 1, wherein said electric quantities further comprises: active power, reactive power, normalized active power, normalized reactive power, and phase displacement between voltage and said current, current harmonics and/or voltage harmonics.

13. The smart plug according to claim 1, wherein said household appliance is a laundry washing machine comprising the following electric loads: a heater device comprising a resistor to heat the washing water, a motor unit provided with a brushed motor or an inverter controlled motor, to rotate the drum, a motor unit of a drain pump comprising synchronous or asynchronous motor, motor units of electro-valves comprising synchronous or asynchronous motor.

14. The smart plug according to claim 13, wherein said electronic controller is further configured to: determine the activation state of said electric resistor of the heater device, when the reactive power has a null value and the active power is different to zero.

15. The smart plug according to claim 13, wherein said electronic controller is further configured to determine the activation of said motor unit when the third current harmonic occurs.

16. The smart plug according to claim 13, wherein said electronic controller is further configured to: determine the activation of said motor unit of said drain pump based on said third current harmonic and the phase displacement between voltage and current.

17. The smart plug according to claim 13, wherein said electronic controller is further configured to determine the concurrent activation of motor units to rotate the drum and drain pump based on the phase displacement between voltage and current.

18. The smart plug according to claim 1, wherein:
said electronic controller is further configured to: determine loads activation profiles of said recognized loads during said operating cycle, compare said determined load activation profiles of said recognized loads with correspondent stored activation profiles of prefixed operating cycles, and determine the operating cycle based on the result of said comparison;
said network system comprises a remote computing system and a home network system; said electronic controller being configured to perform a communication with said remote computing system via said home network system in order to exchange data with the remote computing system; and
said electronic controller is further configured to:
receive from said remote computing system and store in said storage means, load activation profiles associated to the operating cycles which may be performed by the household appliance;
determine load activation profiles based on said electric signatures determined when the household performed the operating cycle; and
determine the operating cycle performed by the household appliance based on said load activation profiles determined when the household appliance performed the operating cycle, and said load activation profiles associated to the operating cycle stored in said storage means.

19. The smart plug according to claim 1, wherein an electric load activated during said operating cycle comprises an electric motor; the electric signature of said electric motor is based on a third current harmonic.

20. The smart plug according to claim 1, wherein an electric load activated during said operating cycle comprises an electric resistor; the electric signature of electric resistor is based on an active power and reactive power.

21. The smart plug according to claim 1, wherein an electric load activated during said operating cycle comprises a motor-controlled valve; the electric signature of said motor-controlled valve is based on a reactive power and prefixed odd current harmonics.

22. The smart plug according to claim 1, wherein:
said electronic controller comprises a first electronic unit and a second electronic unit,
the first electronic unit is configured to:
measure current and voltage of the electric power supplied to said household appliance via said smart plug,
determine electric quantities indicative of at least of current harmonics and/or voltage harmonics, based on said measured current and voltage,
recognize electric loads of said household appliance and the sequence of activation of said electric loads during an operating cycle performed by said household appliance, based on said determined electric quantities, and
determine the operating cycle performed by the household appliance based on said recognized electric loads and the sequence of activation of said electric loads during said operating cycle; and
the second electronic unit is configured to:
communicate said determined operating cycle to said network system.

23. A method for determining operating information of a household appliance by a smart plug which electrically connects a household appliance to power lines, said smart plug including an electric measuring circuit and an electronic controller, and configured to communicate information indicative of operating cycle performed by the household appliance to a network system, the method comprising:
measuring, by the electric measuring circuit, current and voltage of the electric power supplied to said household appliance via said smart plug,
determining, by the electronic controller, electric quantities indicative at least of current harmonics and/or voltage harmonics, based on said measured current and voltage,
recognizing, by the electronic controller, the electric loads of said household appliance and a sequence of activation of said electric loads during an operating cycle performed by said household appliance, based on said determined electric quantities;
determining by the electronic controller, the operating cycle performed by the household appliance based on recognized electric loads and the sequence of activation of said electric loads during said operating cycle;

communicating by the electronic controller, said determined operating cycle to said network system, storing, by the electronic controller, in a storage of said smart plug, electric signatures of said electric loads which contain information indicative of one or more of said electric quantities associated to the activation of electric loads of said household appliance, when the household appliance is performing an operating cycle, determining by the electronic controller, electric signatures of said electric loads based on one or more electric quantities, and recognizing by the electronic controller, said electric loads and the sequence of activation of said electric loads based on said stored load electric signatures and said electric signatures determined when the operating cycle was performed.

24. The method according to claim 23, comprising performing a smart plug auto-tuning program wherein:

when the household appliance is performing a prefixed operating cycle, one or more electric quantities are determined during the predetermined activation of the electric loads;

load electric signatures of said electric loads are determined based on said electric quantities determined in turn during the prefixed operating cycle; and said electric signatures of said electric loads are stored in storage means of said smart plug.

25. The method according to claim 24, comprising:

receiving from said remote computing system and store in said storage means, load activation profiles associated to the operating cycles which may be performed by the household appliance;

determining the load activation profiles based on said electric signatures determined when the household performed the operating cycle; and determining the operating cycle performed by the household appliance based on said activation load profiles determined when the household performed the operating cycle and said activation load profiles associated to the operating cycle stored in said storage means.

26. The method according to claim 23, wherein said electric quantities further comprises: active power, reactive power, normalized active power, normalized reactive power, and phase displacement between voltage and current, and said current harmonics and/or voltage harmonics.

27. The method according to claim 23, wherein:

said smart plug comprises a first electronic unit and a second electronic unit;

the first electronic unit is configured to:
measure current and voltage of the electric power supplied to said household appliance via said smart plug,
determine electric quantities indicative at least of prefixed current harmonics and/or prefixed voltage harmonics, based on said measured current and voltage,
recognize electric loads of said household appliance and the sequence of activation of said electric loads during an operating cycle performed by said household appliance, based on said determined electric quantities; and
determine the operating cycle performed by the household appliance based on said recognized electric loads and the sequence of activation of said electric loads; and the second electronic unit is configured to:
communicate said determined operating cycle to a network system.

28. The method according to claim 23, comprising:

determining loads activation profiles of said recognized electric loads during said operating cycle, comparing said determined load activation profiles of said recognized electric loads with stored activation profiles of prefixed operating cycles, and determining the operating cycle based on the result of said comparison.

* * * * *